(12) United States Patent
Reijnders et al.

(10) Patent No.: US 12,124,173 B2
(45) Date of Patent: Oct. 22, 2024

(54) LITHOGRAPHIC APPARATUS, METROLOGY SYSTEMS, ILLUMINATION SOURCES AND METHODS THEREOF

(71) Applicants: ASML Netherlands B.V., Veldhoven (NL); ASML Holding N.V., Veldhoven (NL)

(72) Inventors: Marinus Petrus Reijnders, Eindhoven (NL); Mohamed Swillam, Wilton, CT (US)

(73) Assignee: ASML Netherlands B.V. & ASML Holding N.V., Veldhoven (NL)

( * ) Notice: Subject to any disclaimer, the term of this patent is extended or adjusted under 35 U.S.C. 154(b) by 67 days.

(21) Appl. No.: 17/790,344

(22) PCT Filed: Dec. 8, 2020

(86) PCT No.: PCT/EP2020/085111
§ 371 (c)(1),
(2) Date: Jun. 30, 2022

(87) PCT Pub. No.: WO2021/136632
PCT Pub. Date: Jul. 8, 2021

(65) Prior Publication Data
US 2023/0058714 A1 Feb. 23, 2023

Related U.S. Application Data

(60) Provisional application No. 62/954,836, filed on Dec. 30, 2019.

(51) Int. Cl.
*G03F 7/00* (2006.01)
(52) U.S. Cl.
CPC ...... *G03F 7/70625* (2013.01); *G03F 7/70141* (2013.01); *G03F 7/70633* (2013.01)

(58) Field of Classification Search
CPC ............ G03F 7/70141; G03F 7/70616; G03F 7/70625; G03F 7/70633; H04B 7/0413;
(Continued)

(56) References Cited

U.S. PATENT DOCUMENTS 6,297,876 B1 10/2001 Bornebroek
6,961,116 B2 11/2005 Den Boef et al.
(Continued)

OTHER PUBLICATIONS

International Search Report and Written Opinion of the International Searching Authority directed to related International Patent Application No. PCT/EP2020/085111, mailed Mar. 31, 2021; 10 pages.
(Continued)

*Primary Examiner* — Deoram Persaud
(74) *Attorney, Agent, or Firm* — Sterne, Kessler, Goldstein & Fox P.L.L.C.

(57) ABSTRACT

A system includes an illumination system, an optical element, and a detector. The optical system is implemented on a substrate. The illumination system includes first and second sources and first and second generators. The illumination system generates a beam of radiation. The first and second sources generate respective first and second different wavelength bands. The first and second resonators are optically coupled to respective ones of the first and second sources and narrow respective ones of the first and second wavelength bands. The optical element directs the beam toward a target structure. The detector receives radiation from the target structure and to generate a measurement signal based on the received radiation.

26 Claims, 10 Drawing Sheets

(58) Field of Classification Search
CPC .............. H04B 7/0456; H04L 25/0204; H04L 25/0228; H04L 5/005; H04L 5/0053; H04L 5/0057; H04L 5/0094

See application file for complete search history.

(56) References Cited

U.S. PATENT DOCUMENTS

| | | | |
|---|---|---|---|
| 7,511,799 B2 | 3/2009 | Tel et al. | |
| 7,990,543 B1 | 8/2011 | Mello et al. | |
| 8,706,442 B2 | 4/2014 | Mos et al. | |
| 9,500,930 B1 | 11/2016 | Soh et al. | |
| 2007/0064223 A1* | 3/2007 | Imai | G01N 21/95607 356/237.1 |
| 2009/0195768 A1 | 8/2009 | Bijnen et al. | |
| 2011/0032500 A1 | 2/2011 | Straaijer | |
| 2011/0280579 A1 | 11/2011 | McLaren et al. | |
| 2011/0310917 A1* | 12/2011 | Krishnamoorthy | H04B 10/506 372/23 |
| 2013/0195446 A1 | 8/2013 | Zheng et al. | |
| 2014/0016931 A1 | 1/2014 | Meade et al. | |
| 2017/0322497 A1 | 11/2017 | Lin et al. | |
| 2018/0238814 A1 | 8/2018 | Sapiens et al. | |
| 2018/0341105 A1 | 11/2018 | Sobolev | |
| 2020/0103679 A1* | 4/2020 | Lee | H01S 5/0071 |
| 2023/0009554 A1* | 1/2023 | Zhao | H01S 3/086 |
| 2023/0213868 A1* | 7/2023 | Swillam | G03F 9/7088 355/67 |

OTHER PUBLICATIONS

Raymond et al., "Multiparameter grating metrology using optical scatterometry," Journal of Vacuum Science & Technology B: Microelectronics and Nanometer Structures Processing, Measurement, and Phenomena, vol. 15, No. 2, Mar. 1997; pp. 361-368.

Niu, Xinhui, "Specular Spectroscopic Scatterometry in DUV Lithography," Proc. of SPIE, vol. 3677, Metrology, Inspection, and Process Control for Microlithography XIII, Jun. 14, 1999; 10 pages.

* cited by examiner

LITHOGRAPHIC APPARATUS, METROLOGY SYSTEMS, ILLUMINATION SOURCES AND METHODS THEREOF

CROSS-REFERENCE TO RELATED APPLICATIONS

This application claims priority of U.S. Provisional Patent Application No. 62/954,836, which was filed on Dec. 30, 2019, and which is incorporated herein in its entirety by reference.

FIELD

The present disclosure relates to metrology systems with integrated optics, for example, illumination systems with integrated photonic devices used in metrology systems for inspecting lithographic processes and wafer alignment.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers can be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

As ICs become smaller and more densely packed, so too increases the number of features that must be inspected per wafer. It is desirable to improve the capabilities of metrology systems in order to keep pace with current high-volume manufacturing rates and improve production speeds beyond what is currently available.

SUMMARY

Accordingly, there is a need to provide metrology tools capable of quickly and accurately measuring a large number of lithographic features. Metrology solutions may include, e.g., increasing the number of simultaneous measurements and/or increasing the speed of a measurement.

In some embodiments, a system comprises an illumination system, an optical element, and a detector. The optical system is implemented on a substrate. The illumination system comprises first and second sources and first and second generators. The illumination system is configured to generate a beam of radiation. The first and second sources are configured to generate respective first and second different wavelength bands. The first and second resonators are optically coupled to respective ones of the first and second sources and are configured to narrow respective ones of the first and second wavelength bands. The optical element is configured to direct the beam toward a target structure. The detector is configured to receive radiation returning from the target structure and to generate a measurement signal based on the received radiation.

In some embodiments, a lithographic apparatus comprises an illumination apparatus, a projection system, and a metrology system. The metrology system comprises an illumination system, an optical element, and a detector. The optical system is implemented on a substrate. The illumination system comprises first and second sources and first and second generators. The illumination apparatus is configured to illuminate a pattern of a patterning device. The projection system is configured to project an image of the pattern onto a target substrate. The illumination system is configured to generate a beam of radiation. The first and second sources are configured to generate respective first and second different wavelength bands. The first and second resonators are optically coupled to respective ones of the first and second sources and are configured to narrow respective ones of the first and second wavelength bands. The optical element is configured to direct the beam toward a target structure. The detector is configured to receive radiation from the target structure and to generate a measurement signal based on the received radiation In some embodiments, a method comprises generating a beam of radiation using an illumination system on a substrate, the illumination system comprising first and second sources and respective first and second resonators. The method further comprises generating a first wavelength band of the beam using the first source, generating second wavelength band of the beam that is different from the first wavelength band using the second source, narrowing the first wavelength band using the first resonator, narrowing the second wavelength band using the second resonator, directing the beam toward a target structure, receiving radiation from the target structure using a detector, and generating a measurement signal based on the received radiation using the detector.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1A:
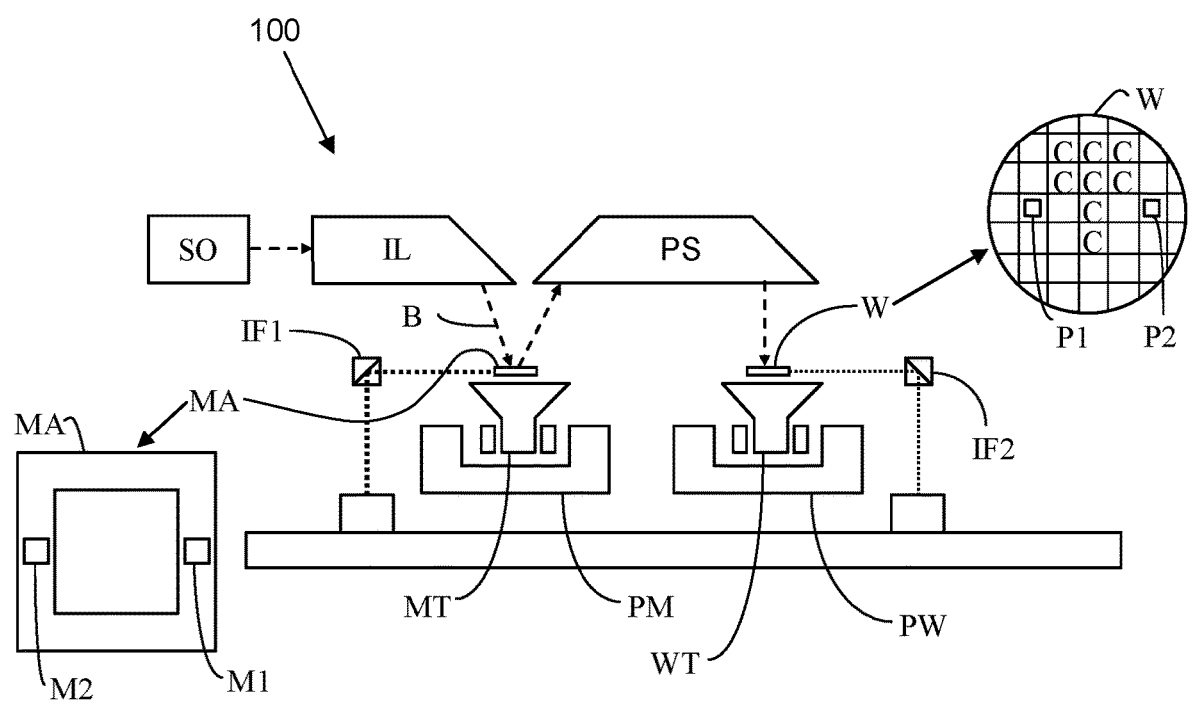
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
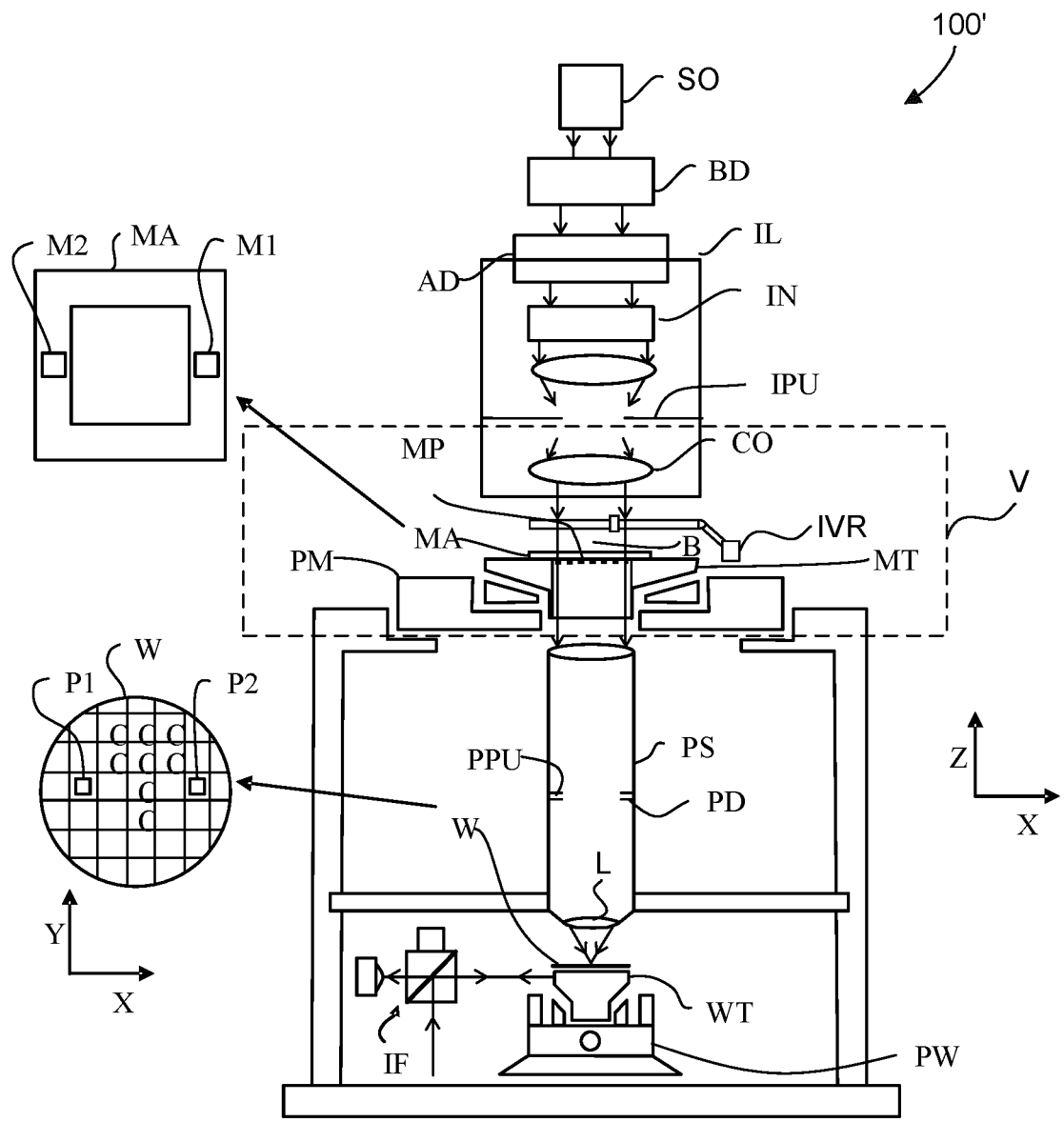
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU.

Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
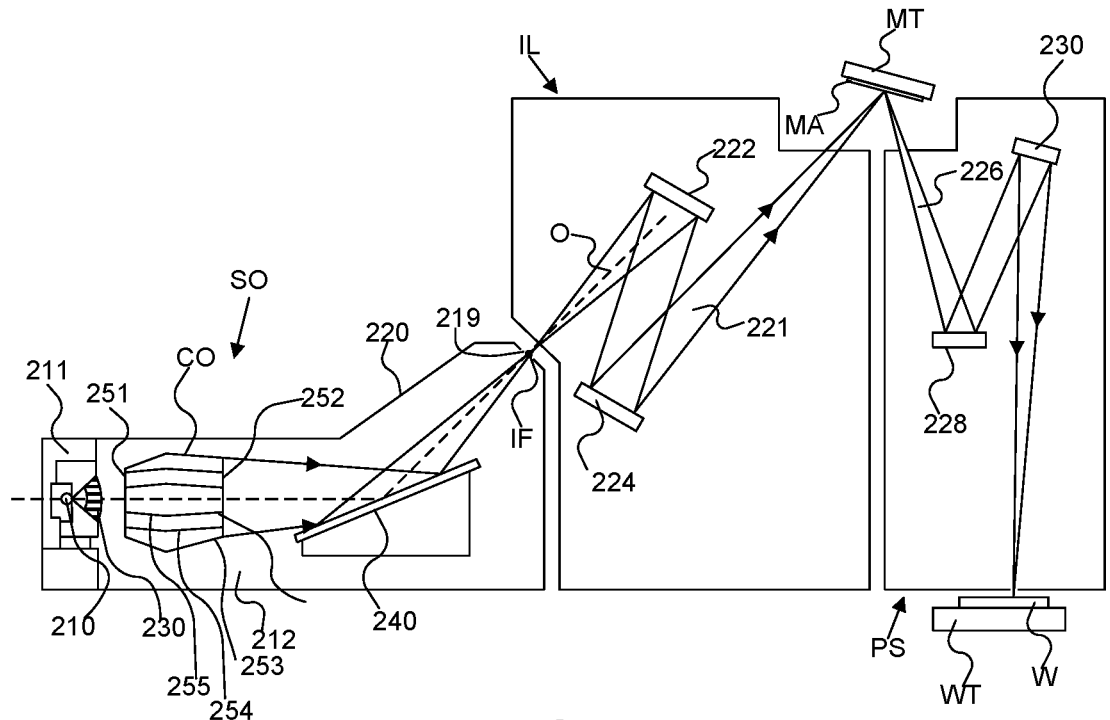
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
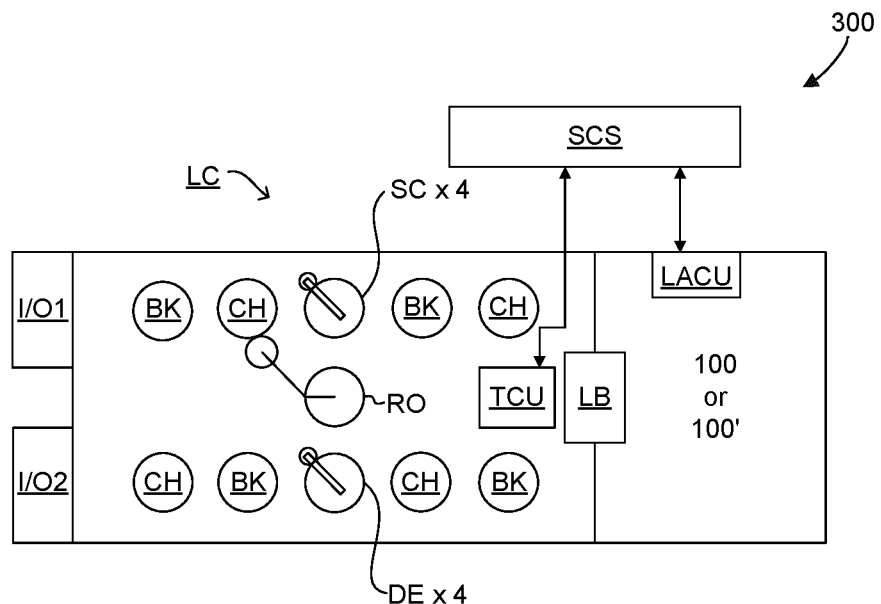
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Inspection Apparatuses

In order to control the lithographic process to place device features accurately on the substrate, alignment marks are generally provided on the substrate, and the lithographic apparatus includes one or more alignment apparatuses and/or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.), which is incorporated by reference herein in its entirety. Generally, marks are measured separately to obtain X- and Y-positions. A combined X- and Y-measurement may be performed using the techniques described in U.S. Publication No. 2009/195768 A (Bijnen et al.), which is also incorporated by reference herein in its entirety.

The terms "inspection apparatus," "metrology apparatus," and the like may be used herein to refer to, e.g., a device or system used for measuring a property of a structure (e.g., overlay error, critical dimension parameters) or used in a lithographic apparatus to inspect an alignment of a wafer (e.g., alignment apparatus).

Figure 4A:
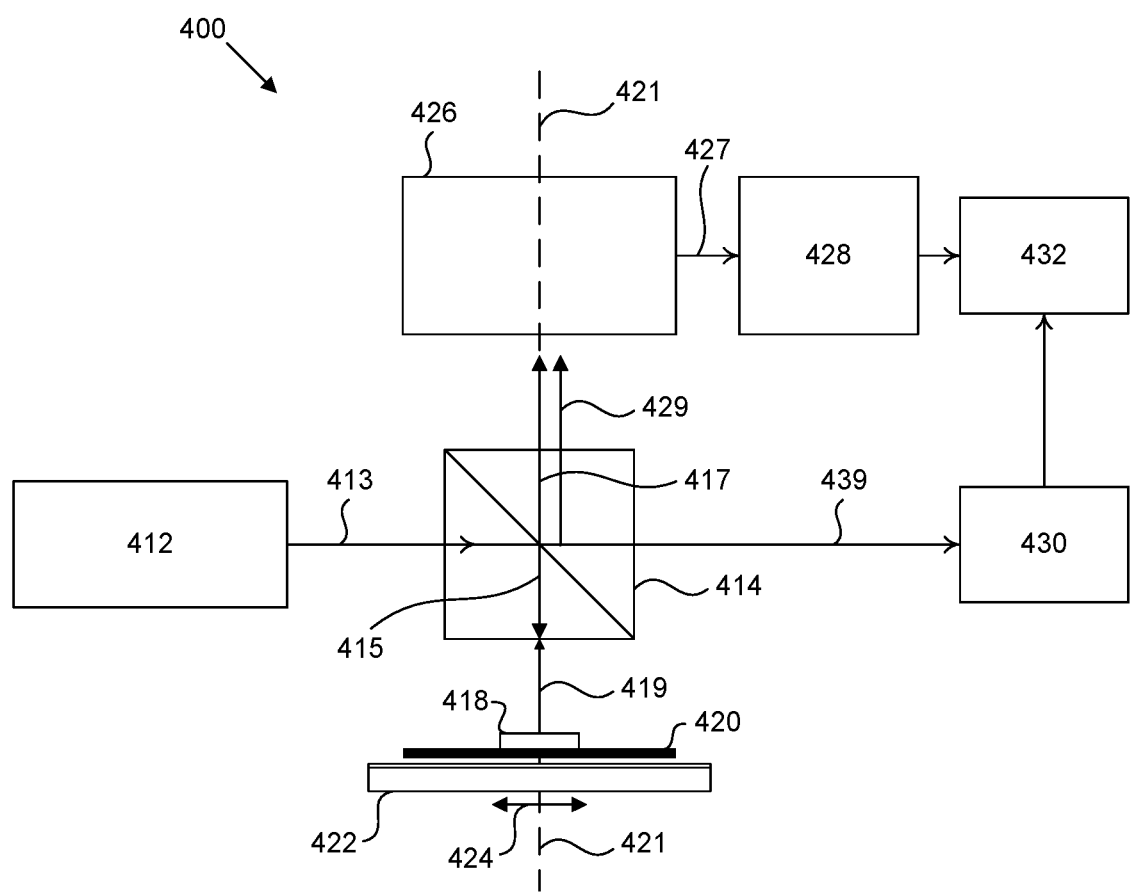
FIGS. 4A and 4B show schematics of alignment apparatuses, according to some embodiments.

FIG. 4A shows a schematic of a cross-sectional view of a metrology apparatus 400, according to some embodiments. In some embodiments, metrology apparatus 400 may be implemented as part of lithographic apparatus 100 or 100'. Metrology apparatus 400 may be configured to align a substrate (e.g., substrate W) with respect to a patterning device (e.g., patterning device MA). Metrology apparatus 400 may be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate.

In some embodiments, metrology apparatus 400 may include an illumination system 412, a beam splitter 414, an interferometer 426, a detector 428, a beam analyzer 430, and an overlay calculation processor 432. Illumination system 412 may be configured to provide an electromagnetic narrow band radiation beam 413 having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm. Illumination system 412 may be further configured to provide one or more passbands having substantially constant center wavelength (CWL) values over a long period of time (e.g., over a lifetime of illumination system 412). Such configuration of illumination system 412 may help to prevent the shift of the actual CWL values from the desired CWL values, as discussed above, in current alignment systems. And, as a result, the use of constant CWL values may improve long-term stability and accuracy of alignment systems (e.g., metrology apparatus 400) compared to the current alignment apparatuses.

In some embodiments, beam splitter 414 may be configured to receive radiation beam 413 and split radiation beam 413 into at least two radiation sub-beams. For example, radiation beam 413 may be split into radiation sub-beams 415 and 417, as shown in FIG. 4A. Beam splitter 414 may be further configured to direct radiation sub-beam 415 onto a substrate 420 placed on a stage 422. In one example, the stage 422 is movable along direction 424. Radiation sub-beam 415 may be configured to illuminate an alignment mark or a target 418 located on substrate 420. Alignment mark or target 418 may be coated with a radiation sensitive film. In some embodiments, alignment mark or target 418 may have one hundred and eighty degrees (i.e., 180°) symmetry. That is, when alignment mark or target 418 is rotated 180° about an axis of symmetry perpendicular to a plane of alignment mark or target 418, rotated alignment mark or target 418 may be substantially identical to an unrotated alignment mark or target 418. The target 418 on substrate 420 may be a resist layer grating comprising bars that are formed of solid resist lines, a product layer grating, a composite grating stack in an overlay target structure comprising a resist grating overlaid or interleaved on a product layer grating, or the like. The bars may alternatively be etched into the substrate. This pattern may be sensitive to chromatic aberrations in the lithographic projection apparatus, particularly the projection system PL, and illumination symmetry and the presence of such aberrations may manifest themselves in a variation in the printed grating. In one example, an in-line method used in device manufacturing for measurements of line width, pitch, and critical dimension makes use of a technique known as "scatterometry". For example, methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

In some embodiments, beam splitter 414 may be further configured to receive diffraction radiation beam 419 and split diffraction radiation beam 419 into at least two radiation sub-beams, according to an embodiment. Diffraction radiation beam 419 may be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements may be used to obtain the similar result of illuminating alignment mark or target 418 on substrate 420 and detecting an image of alignment mark or target 418.

As illustrated in FIG. 4A, interferometer 426 may be configured to receive radiation sub-beam 417 and diffracted radiation sub-beam 429 through beam splitter 414. In an example embodiment, diffracted radiation sub-beam 429 may be at least a portion of radiation sub-beam 415 that may be reflected from alignment mark or target 418. In an example of this embodiment, interferometer 426 comprises any appropriate set of optical-elements, for example, a combination of prisms that may be configured to form two images of alignment mark or target 418 based on the received diffracted radiation sub-beam 429. It should be appreciated that a good quality image need not be formed, but that the features of alignment mark 418 should be resolved. Interferometer 426 may be further configured to rotate one of the two images with respect to the other of the two images 180° and recombine the rotated and unrotated images interferometrically.

In some embodiments, detector 428 may be configured to receive the recombined image via interferometer signal 427 and detect interference as a result of the recombined image when alignment axis 421 of metrolgoy apparatus 400 passes through a center of symmetry (not shown) of alignment mark or target 418. Such interference may be due to alignment mark or target 418 being 180° symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. Detector 428 may be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data may for example be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 may be configured to receive and determine an optical state of diffracted radiation sub-beam 439. The optical state may be a measure of beam wavelength, polarization, or beam profile. Beam analyzer 430 may be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 may be configured to determine a position of metrology apparatus 400 or any other reference element such that the center of symmetry of alignment mark or target 418 can be known with reference to metrology apparatus 400 or any other reference element. Beam analyzer 430 may be a point or an imaging polarimeter with some form of wavelength-band selectivity. In some embodiments, beam analyzer 430 may be directly integrated into metrology apparatus 400, or connected via fiber optics of several types: polarization preserving single mode, multimode, or imaging, according to other embodiments.

In some embodiments, beam analyzer 430 may be further configured to determine the overlay data between two patterns on substrate 420. One of these patterns may be a reference pattern on a reference layer. The other pattern may be an exposed pattern on an exposed layer. The reference layer may be an etched layer already present on substrate 420. The reference layer may be generated by a reference pattern exposed on the substrate by lithographic apparatus 100 and/or 100'. The exposed layer may be a resist layer exposed adjacent to the reference layer. The exposed layer may be generated by an exposure pattern exposed on substrate 420 by lithographic apparatus 100 or 100'. The exposed pattern on substrate 420 may correspond to a movement of substrate 420 by stage 422. In some embodiments, the measured overlay data may also indicate an offset between the reference pattern and the exposure pattern. The measured overlay data may be used as calibration data to calibrate the exposure pattern exposed by lithographic apparatus 100 or 100', such that after the calibration, the offset between the exposed layer and the reference layer may be minimized.

In some embodiments, beam analyzer 430 may be further configured to determine a model of the product stack profile of substrate 420, and may be configured to measure overlay, critical dimension, and focus of target 418 in a single measurement. The product stack profile contains information on the stacked product such as alignment mark, target 418, substrate 420, or the like and may include mark process variation-induced optical signature metrology that is a function of illumination variation. The product stack profile may also include product grating profile, mark stack profile, mark asymmetry information, or the like. An example of beam analyzer 430 may be found in the metrology apparatus known as Yieldstar™, manufactured by ASML, Veldhoven, The Netherlands, as described in U.S. Pat. No. 8,706,442, which is incorporated by reference herein in its entirety. Beam analyzer 430 may be further configured to process information related to a particular property of an exposed pattern in that layer. For example, beam analyzer 430 may process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) may be connected to beam analyzer 430, and allows the possibility of accurate stack profile detection as discussed below. For example, detector 428 may be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that may be read-out at high speed and are especially of interest if phase-stepping detection is used.

Figure 4B:
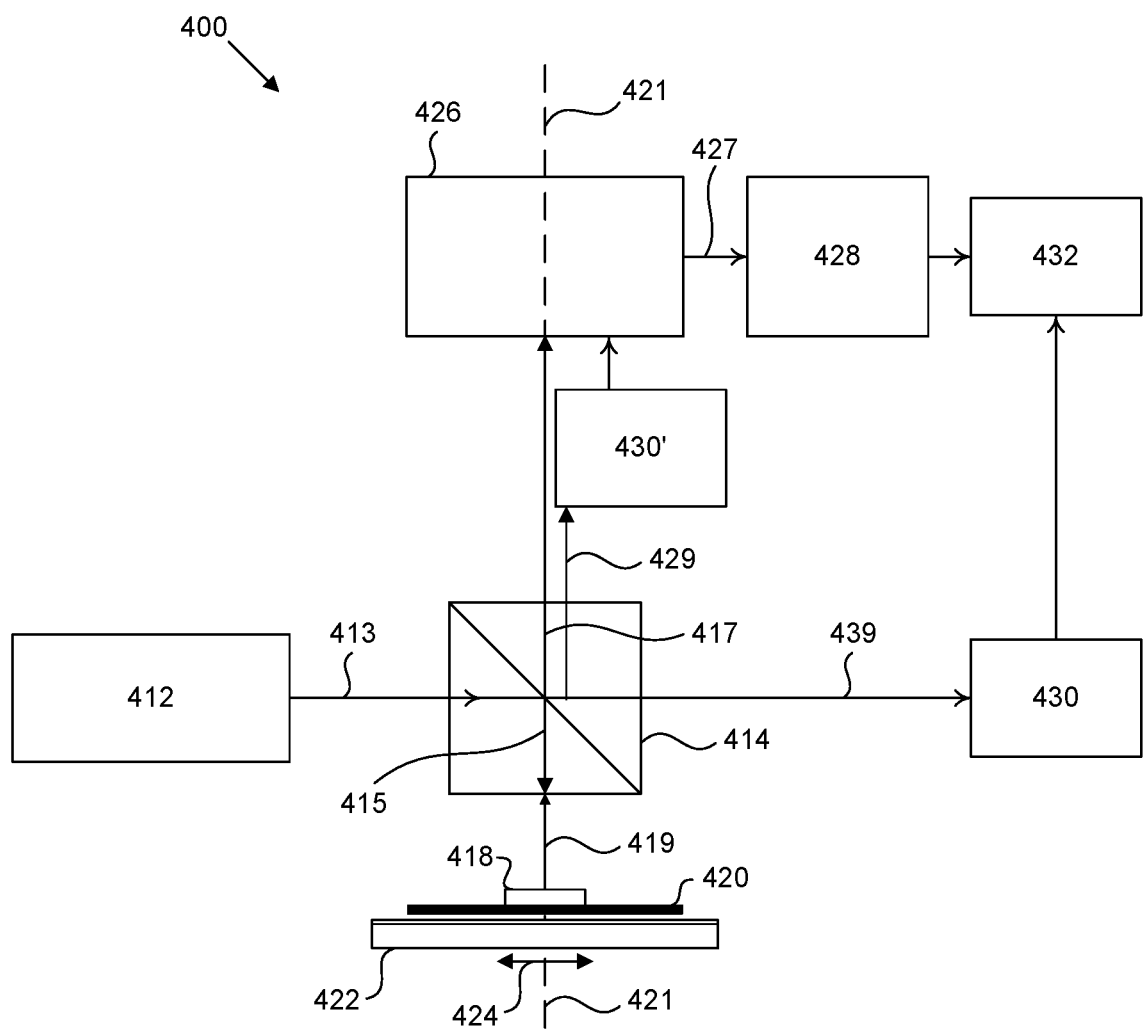

In some embodiments, a second beam analyzer 430' may be configured to receive and determine an optical state of diffracted radiation sub-beam 429, as shown in FIG. 4B. The optical state may be a measure of beam wavelength, polarization, beam profile, or the like. Second beam analyzer 430' may be identical to beam analyzer 430. Alternatively, second beam analyzer 430' may be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' may also be configured to determine a position of metrology apparatus 400, or any other reference element, such that the center of symmetry of alignment mark or target 418 may be known with reference to metrology apparatus 400, or any other reference element. Second beam analyzer 430' may be further configured to determine the overlay data between two patterns and a model of the product stack profile of substrate 420. Second beam analyzer 430' may also be configured to measure overlay, critical dimension, and focus of target 418 in a single measurement.

In some embodiments, second beam analyzer 430' may be directly integrated into metrology apparatus 400, or it may be connected via fiber optics of several types: polarization preserving single mode, multimode, or imaging, according to other embodiments. Alternatively, second beam analyzer 430' and beam analyzer 430 may be combined to form a single analyzer (not shown) configured to receive and determine the optical states of both diffracted radiation sub-beams 429 and 439.

In some embodiments, processor 432 receives information from detector 428 and beam analyzer 430. For example, processor 432 may be an overlay calculation processor. The information may comprise a model of the product stack profile constructed by beam analyzer 430. Alternatively, processor 432 may construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 may create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 may utilize the basic correction algorithm to characterize the metrology apparatus 400 with reference to wafer marks and/or alignment marks 418.

In some embodiments, processor 432 may be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 may utilize a clustering algorithm to group the marks into sets of similar constant offset error, and create an alignment error offset correction table based on the information. The clustering algorithm may be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error may be deduced. Table 1 illustrates how this may be performed. The smallest measured overlay in the example shown is −1 nm. However, this is in relation to a target with a programmed overlay of −30 nm. Consequently, the process must have introduced an overlay error of 29 nm.

TABLE 1

| Programmed overlay | −70 | −50 | −30 | −10 | 10 | 30 | 50 |
|---|---|---|---|---|---|---|---|
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value may be taken to be the reference point and, relative to this, the offset may be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 may also be obtained from marks and target 418 under different illumination settings, the illumination setting, which results in the smallest overlay error, and its corresponding calibration factor, may be determined and selected. Following this, processor 432 may group marks into sets of similar overlay error. The criteria for grouping marks may be adjusted based on different process controls, for example, different error tolerances for different processes.

In some embodiments, processor 432 may confirm that all or most members of the group have similar offset errors, and apply an individual offset correction from the clustering algorithm to each mark, based on its additional optical stack metrology. Processor 432 may determine corrections for each mark and feed the corrections back to lithographic apparatus 100 or 100' for correcting errors in the overlay, for example, by feeding corrections into the alignment apparatus 400.

Exemplary Metrology Systems Using Integrated Photonics

Until now, the discussion has focused on metrology devices that use optical hardware (e.g., beam splitter 414, interferometer 426, etc.) to collect and direct light received by, e.g., scattered by, the target structure toward a detector. The optical hardware is also often needed for correcting aberrations or otherwise adjusting radiation that has been scattered by a target structure. In some examples, size requirements of light-directing optical hardware may be accompanied by large sensor footprints, e.g., in the order of approximately 20 mm×20 mm or greater. In these examples, due to large sensor footprints, metrology systems may include only one or a few devices for inspecting a wafer, which may impact the ability to inspect large numbers of wafers in a given time frame. The speed of wafer inspection can be increased by, for example, decreasing the time per measurement (e.g., by collecting more photons) and/or increasing the number of available measurement devices (e.g., by shrinking the device footprint and adding more of them). Embodiments of the present disclosure provide structures and functions to more quickly and efficiently perform inspection of structures on a substrate.

Figure 5:
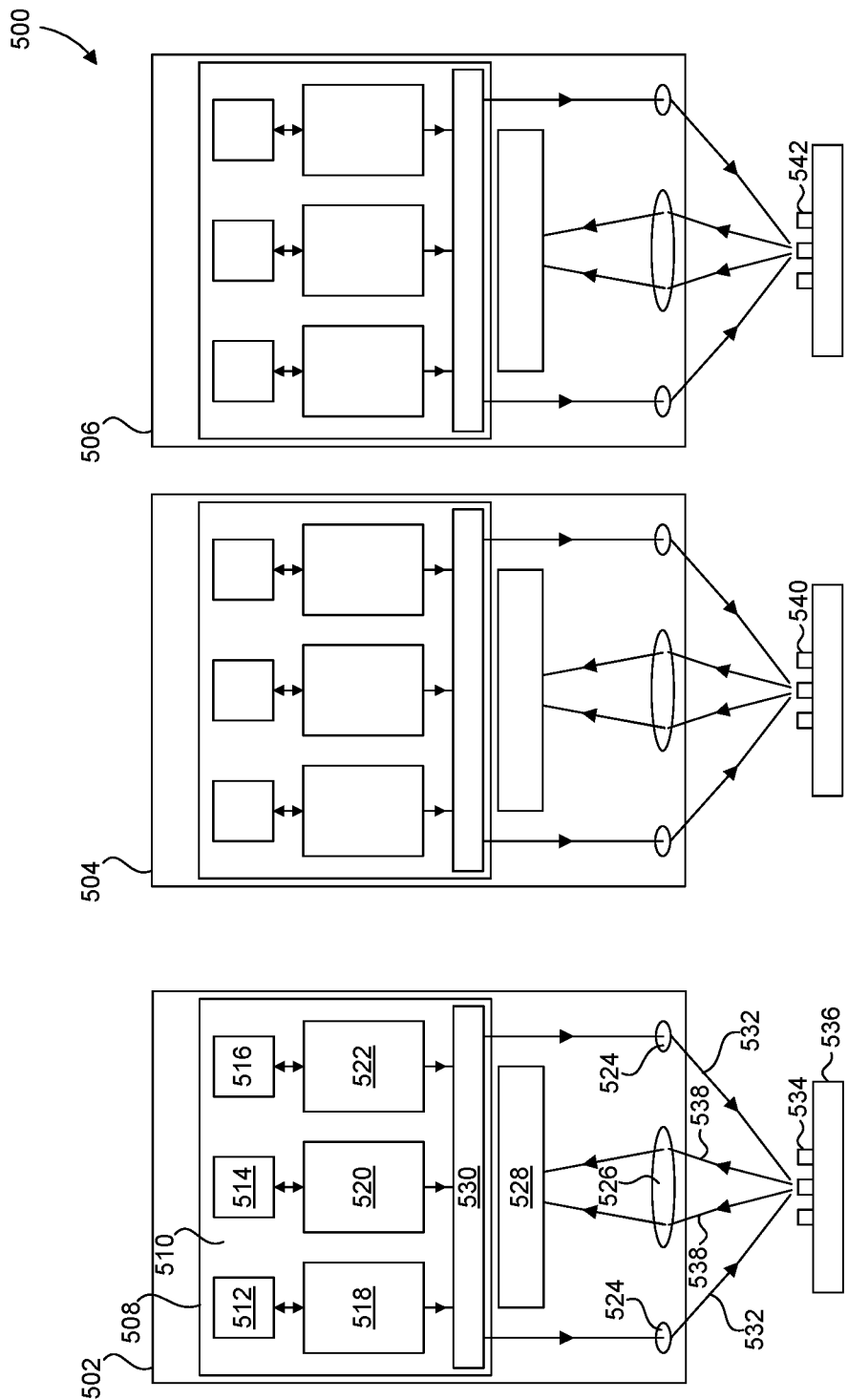
FIG. 5 shows a schematic of a metrology system, according to some embodiments.

FIG. 5 shows a schematic of a metrology system 500, according to some embodiments. In some embodiments, metrology system 500 comprises a metrology apparatus 502. Metrology apparatus 502 may comprise an illumination system 508, an optical element(s) 524, and a detector 528. Illumination system 508 may comprise a substrate 510, sources 512 and 514 (or first and second sources), and resonators 518 and 520 (or first and second resonators). Illumination system 508 may comprise additional structures, for example, additional source(s) 516, additional resonator(s) 522, and/or a multiplexer 530. Metrology apparatus 502 may also comprise additional structures, for example, an optical element 526 and other structures not shown here, but described in reference to other figures (e.g., illumination monitor).

In some embodiments, all or some of the structures of metrology apparatuses in embodiments herein may be part of an integrated photonic device. For example, at least a portion of illumination system 508 may be implemented on substrate 510 as part of an integrated photonic device that comprises at least source 512 and resonator 518. It should be appreciated that the arrangement shown in FIG. 5—e.g., where the sources, resonators, and multiplexer are on the substrate—is merely an example and that embodiments may be envisaged in which certain structures may be disposed detached from substrate 510 or on multiple substrates brought together. For example, at least a portion of illumination system 508 comprises may comprise an integrated photonic device comprising at least source 512 and resonator 518. Those skilled in the art will appreciate the numerous arrangements that may be envisaged.

In some embodiments, illumination system 508 may be configured to generate a beam of radiation 532 or more than one of beam of radiation 532. For generating beam of radiation 532, source 512, source 514, and/or additional source(s) 516 may generate radiation having different wavelength bands. For example, source 512 may generate a first wavelength band and source 514 may generate a second wavelength band that is different from the first wavelength band—i.e., first and second sources may be configured to generate respective first and second different wavelength bands.

In some embodiments, source 512, source 514, and additional source(s) 516 may be laser-like, for example, each comprising a superluminescent diode (SLED). A laser-like source may comprise a p-n junction and a limited gain medium (e.g., single-pass), and generate amplified spontaneous emission (typically more intense than a typical light-emitting diode (LED)). However, unlike a laser, the laser-like source lacks feedback in the gain medium for lasing to occur. The laser-like source may comprise a broader, continuous spectrum than a laser.

In some embodiments, resonator 518, resonator 520, and additional resonator(s) 522 may be optically coupled to respective ones of source 512, source 514, and additional source(s) 516, as indicated by bidirectional arrows respectively therebetween in FIG. 5. Though functions and relationships between resonator 518 and source 512 are described hereon, it should be appreciated that resonator 520, source 514, additional resonator(s) 522, and additional source(s) 516 may have functions and relationships similar to those described in reference to resonator 518 and source 512. In some embodiments, source 512 may optically interact with resonator 518 such that a property of radiation from source 512 is altered. For example, resonator 518 may provide a feedback mechanism to source 512 such that source 512, which may increase gain and narrow the wavelengths generated by source 512 (e.g., operates more like a laser). Thus, resonator 518 may narrow the first wavelength band (e.g., of source 512).

In some embodiments, resonator 518 may comprise a gain medium. Resonator 518 may comprise, for example, a ring resonator, a medium bounded on opposite sides with two reflectors, and the like. Resonator 518 may be adjusted based on user input (e.g., by changing a temperature (thermo-optic)). Particularly, one or more properties of resonator 518 may be adjusted. The adjusted one or more properties of resonator 518 may be, for example, at resonant wavelength and/or Q-factor. Additionally or in the alternative, other adjustment mechanisms may be used (e.g., piezo-electric, piezo-optic, electro-optic, electrostatic, and the like). For example, a variable absorber or transmission apparatus may be used to attenuate or leak radiation by changing the local material properties using at least one of the adjustment mechanisms described above. Adjustment mechanisms capable of high modulation frequencies may be suitable for fast wavelength switching to increase wafer production throughput (e.g., piezo-electric devices may operate in the kilohertz to megahertz range). The adjustment may also be used in a feedback loop to stabilize source 512. As mentioned, the other resonators and sources function in a similar manner In a non-limiting example of multiple sources and resonators, it may be that first and second resonators are optically coupled to respective ones of the first and second sources and configured to narrow respective ones of the first and second wavelength bands. In another non-limiting example, a third source may be configured to generate a third wavelength band of beam of radiation 532 that is different from the first and second wavelength bands. A third resonator may be optically coupled to the third source and configured to narrow the third wavelength band.

In some embodiments, adjustable wavelength filters may also be used instead of or in addition to the resonators. Some examples of adjustable wavelength filters include, acousto-optic tunable filters, wavelength multiplexers/demultiplexers, wavelength switches, tunable waveguides, monochromators, Bragg filters, and the like. Ring resonators may also be used as wavelength filters.

In some embodiments, a multiplexer 530 may be disposed downstream of resonator 518, resonator 520, and/or additional resonator(s) 522. Multiplexer 530 may combine radiation from resonator 518, resonator 520, and/or additional resonator(s) 522 such that, for example, the received radiation of different wavelengths are directed along a shared optical path. In a non-limiting example, multiplexer 530 may be configured to direct radiation corresponding to the first wavelength band and radiation corresponding to the second wavelength band along a shared optical axis (even more wavelengths may be multiplexed). Illumination system 508 may be configured to generate two or more narrow wavelength bands simultaneously or in a sequence.

In some embodiments, using resonator 518, resonator 520, and/or additional resonator(s) 522, illumination system 508 may select at least one of the narrowed wavelength bands. Using source 512, source 514, and additional source(s) 516, illumination system 508 may be configured to operate within a broad wavelength range, for example, between approximately ultraviolet (UV) to infrared (IR) (e.g., approximately 200-2000 nm). At least one of the narrowed wavelength bands may be approximately 20 nm wide or less, 10 nm wide or less, 5 nm wide or less, 1 nm wide or less, 0.5 nm wide or less, or 0.1 nm wide or less. Illumination system 508 may adjust the narrowed wavelength band based on a modulation of a resonant wavelength of the respective resonator (e.g., using adjustment mechanisms such as piezo-electric, piezo-optic, electro-optic, electrostatic, and the like). In a non-limiting example, the illumination system is configured to adjust a width of at least one of the narrowed respective ones of the first and second wavelength bands based on a modulation of a resonant wavelength of a respective one of the first and second resonators. In some embodiments, illumination system 508 may be configured to operate within a wavelength range, for example, in the visible range (e.g., approximately 400-800 nm) and/or the infrared range (e.g., approximately 800-1800 nm).

In some embodiments, the aggregate of source 512, source 514, and additional source(s) 516 may cover a broad range of wavelengths without gaps. In order to avoid gaps in wavelengths delivered by illumination system 508, sources may have overlapping spectral bands (e.g., one or more shared wavelengths at the overlap). In a non-limiting example, the first and second wavelength bands comprise a shared wavelength.

In some embodiments, a single one of optical element(s) 524 and optical element 526 may be a single optical component (e.g., one lens) or a system of multiple components, for example, any number and permutation of lenses and reflectors. Optical element(s) 524 may receive multiplexed radiation from multiplexer 530. That is, optical element(s) 524 may be disposed downstream of multiplexer 530. Optical element(s) 524 may direct beam of radiation 532 toward target structure 534. Target structure 534 may be disposed on a substrate 536 (e.g., a wafer) (also "target substrate"). Target structure 534 may comprise an alignment mark, a product feature, or the like. Target structure 534 may reflect, refract, diffract, scatter, or the like radiation to generate radiation 538. For ease of discussion, and without limitation, radiation will be termed scattered radiation throughout. Detector 528 may receive scattered radiation 538. Optical element 526 may be used to direct and/or focus scattered radiation 538 onto detector 528. Optical element(s) 524 and optical element 526 may be at least one of an illumination-redirecting element (e.g., reflector) and a focusing element. Optical element(s) 524 and/or optical element 526 may be disposed on substrate 510 (e.g., fabricated monolithically or assembled from separate, modular components).

In some embodiments, multiplexer 530 may be optional (e.g., may be omitted). In the absence of multiplexer 530, optical element(s) 524 may be disposed downstream of resonator 518, resonator 520, and/or additional resonator(s) 522. Radiation from resonator 518, resonator 520, and/or additional resonator(s) 522 may be guided to one of optical element(s) 524. In some embodiments, radiation from resonator 518, resonator 520, and/or additional resonator(s) 522 may be guided to respective ones of optical element(s) 524 (e.g., along different optical paths). Then, respective ones of optical element(s) 524 may output radiation, for example, at different angles.

In some embodiments, at least one of optical element(s) 524 may comprise a polarizer. In embodiments having distinct optical paths for respective sources, optical element(s) 524 on each optical path may comprise a polarizer. Illumination system 508 may adjust a polarization of beam of radiation 532 based on user-input. For example, a user may desire a given wavelength and polarization. In this scenario, a user may provide input to metrology system 500 (e.g., via a user interface). Illumination system 508 may then adjust a polarizer. In some embodiments, illumination system may select an optical path to activate (e.g., the optical path associated with source 512) while unpowering the other sources or otherwise suppressing the output of the other sources.

In some embodiments, scattered radiation 538 may be received at detector 528. Detector 528 may generate a measurement signal based on the received radiation. detector 528 comprises an image capture device (e.g., a camera). The measurement signal may include data of the detected image.

In some embodiments, a different illumination system may be used. For example, a broadband, white light source may be used. However, a white light source, when powered, generates its full spectrum and it is up to wavelength filtering elements to select narrowband wavelength ranges therefrom. However, in doing so, a large portion of the spectrum is wasted (e.g., photons not in the narrowband wavelength range are discarded). Illumination system 508 may be capable of overcoming such an inefficient use illumination energy. For example, a narrowband wavelength range may be selected from source 512 using resonator 518. Since other wavelengths may not be needed at the given moment, source 514 and/or additional source(s) 516 may be unpowered while source 512 is powered. In some embodiments, source 514 and/or additional source(s) 516 may have a suppressed output while source 512 is powered. For suppressing output, radiation may be, for example, blocked using an opaque element, an element with adjustable transmission, or directing the radiation into a beam dump. In a non-limiting example, the first source is configured to be unpowered or have a suppressed output while the second source is powered.

In some embodiments, metrology apparatus 502 may comprise any number of waveguides to guide radiation, for example, from one element to the next. In some embodiments, waveguides may optically couple a resonator (e.g., resonator 518) to its respective source (source 512). The waveguides may be fabricated on substrate 510 (e.g., monolithically).

In some embodiments, structures of metrology apparatus 502 may be modular. For example, substrate 510 may be a modular structure. Source diodes may have limited lifetimes. It is convenient to be able to remove and replace wear-and-tear components. Therefore, source 512, source 514, additional source(s) 516, resonator 518, resonator 520, and/or additional resonator(s) 522 may be on a separable part of illumination system 508. The structures may still be part of an integrated photonic device implemented on substrate 510. For example, the sources may be their own integrated photonic device components that can be assembled onto substrate 510. An interface may be designed in which different wavelengths bands and/or polarizations may be output at specific locations of the substrate (e.g., designs with aligned sources and resonators).

In some embodiments, metrology system 500 may comprise a second metrology apparatus 504 and/or additional metrology apparatus(es) 506. Structures and functions of metrology apparatus 504 and/or additional metrology apparatus(es) 506 may be the same or similar to metrology apparatus 502. In some embodiments, metrology apparatus 504 may be used to interrogate or inspect a target structure 540 (or second target structure). Additional metrology apparatus(es) 506 may be used to interrogate or inspect additional target structure(s) 542 (or corresponding structures). In a non-limiting alternative description, it may be that metrology system 500 further comprise a second illumination system on a second substrate. The second illumination system may be configured to generate a second beam of radiation. The second illumination system may comprise first and second sources configured to generate respective first and second different wavelength bands of the second beam. The second illumination system may comprise first and second resonators optically coupled to respective ones of the first and second sources of the second illumination system. The first and second resonators may be configured to narrow respective ones of the first and second wavelength bands of the second beam. Metrology system 500 may further comprise a second optical element configured to direct the second beam toward a second target structure and a second detector configured to receive radiation scattered by the second target structure and to generate a measurement signal based on the received radiation scattered by the second target structure. It should also be appreciated that additional iterations of illumination systems, optical elements, and detectors may be envisaged.

As mentioned earlier, speed of wafer inspection may be increased by, for example, increasing the number of available measurement devices (e.g., by shrinking the device footprint and adding more of them). In some embodiments, implementation of integrated photonics allows reduction of device footprint by eliminating the need for large optical hardware. In some embodiments, an integrated-photonics-based metrology apparatus (e.g., metrology apparatus 502) may comprise a footprint having an area less than approximately 2000 mm$^2$, 1000 mm$^2$, 500 mm$^2$, 100 mm$^2$, 50 mm$^2$, 25 mm$^2$, or 16 mm$^2$. The PIC-based metrology system may comprise a footprint having a width less than approximately 40 mm, 30 mm, 20 mm, 10 mm, 7 mm, 5 mm, or 4 mm By transitive property, these dimensions may also apply to footprints of individual elements within the integrated-photonics-based metrology apparatus.

Figure 6:
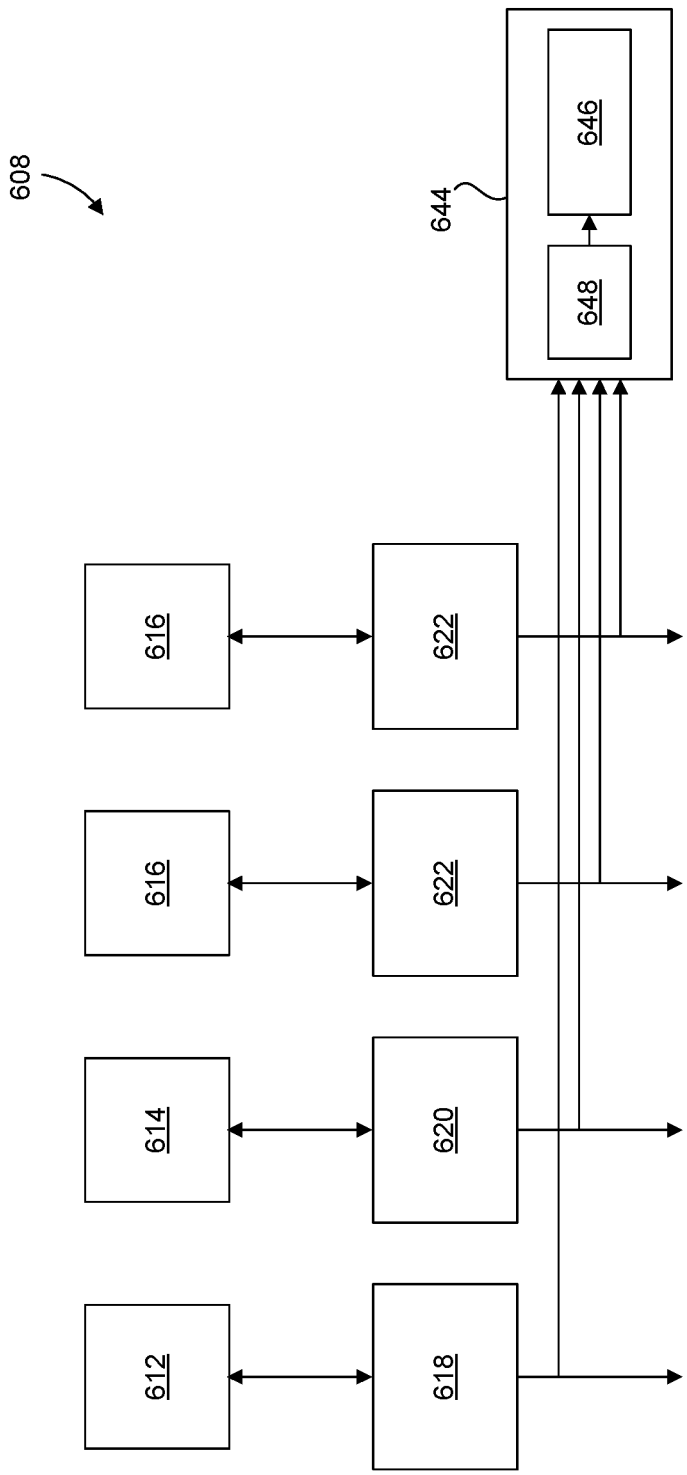
FIG. 6 shows a schematic of an illumination system, according to some embodiments.

FIG. 6 shows a schematic of an illumination system 608, according to some embodiments. It should be appreciated that any of the structures and functions described in reference to FIG. 5 may also be included in embodiments referencing FIG. 6. For example, in some embodiments, illumination system 608 as shown in FIG. 6 may provide a more detailed view of illumination system 508 (FIG. 5).

Unless otherwise noted, elements of FIG. 6 that have similar reference numbers as elements of FIG. 5 may have similar structures and functions (e.g., reference numbers sharing the two right-most numeric digits). For example, in some embodiments, a source 612, a source 614, additional source(s) 616, a resonator 618, a resonator 620, and/or additional resonator(s) 622 of illumination system 608 may have the same or similar structures and functions as previously described for source 512, source 514, additional source(s) 516, resonator 518, resonator 520, and/or additional resonator(s) 522 in reference to FIG. 5.

In some embodiments, illumination system 608 may further comprise an illumination monitor 644. Illumination monitor 644 may comprise a spectrum monitor 646 and/or a multiplexer 648. Spectrum monitor 646 may comprise a spectrometer, spectrum analyzer, and the like.

In some embodiments, illumination system 608 may send a portion of the radiation output by resonator 618, resonator 620, and/or additional resonator(s) 622 (e.g., using a beam splitting element) to illumination monitor 644. Illumination monitor 644 may monitor one or more properties of a beam of radiation (e.g., beam of radiation 532 (FIG. 5). For example, illumination monitor 644 may determine if the radiation output by resonator 618, resonator 620, and/or additional resonator(s) 622 have suitable properties for metrology (e.g., stability, dose, position, intensity, polarization, spectral bandwidth, wavelength, and the like). Multiplexer 648 may combine radiation from resonator 618, resonator 620, and/or additional resonator(s) 622 such that radiation of different wavelengths are directed to spectrum monitor 646. In some embodiments, radiation sent to illumination monitor 644 may already be multiplexed (e.g., using multiplexer 530 (FIG. 5) and multiplexer 648 may be omitted. Illumination monitor 644 may be configured to analyze non-multiplexed radiation (multiplexer is optional).

In some embodiments, illumination monitor 644 may monitor a feedback loop formed by a source and a resonator (e.g., source 512 and resonator 518 (FIG. 5)).

Figure 7:
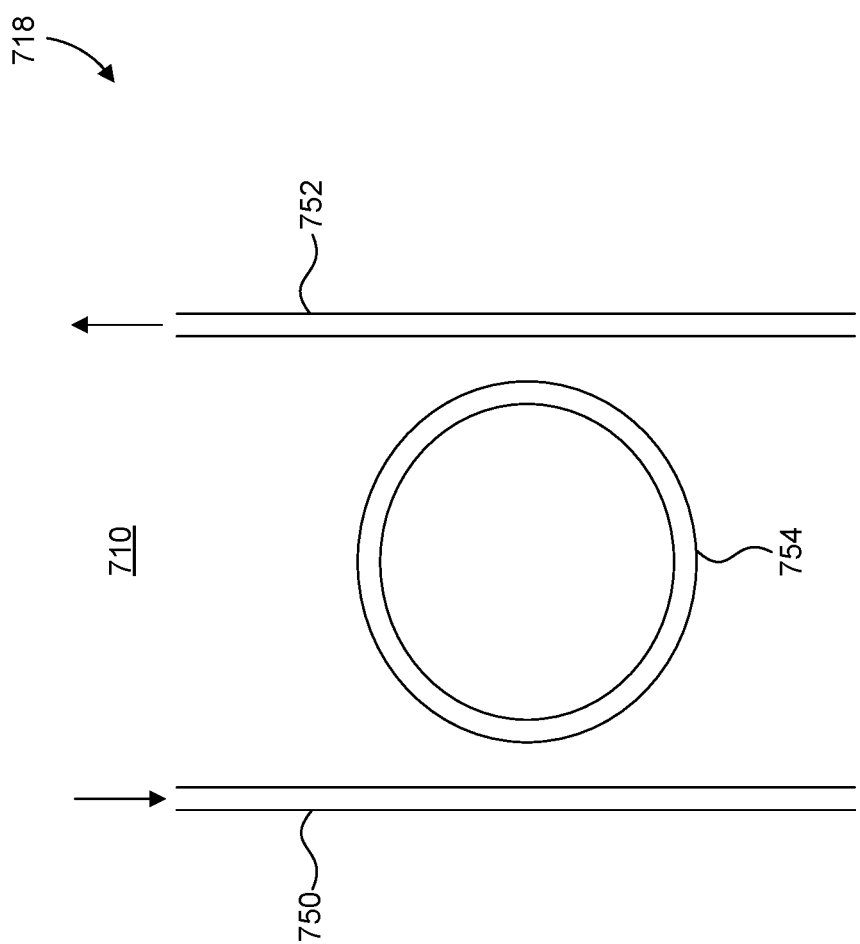
FIG. 7 shows a schematic of a ring resonator, according to some embodiments.

FIG. 7 shows a schematic of a ring resonator 718, according to some embodiments. It should be appreciated that any of the structures and functions described in reference to FIGS. 5 and 6 may also be included in embodiments referencing FIG. 7. For example, in some embodiments, ring resonator 718 as shown in FIG. 7 may provide a more detailed view of resonator 518, resonator 520, and/or additional resonator(s) 522. Unless otherwise noted, elements of FIG. 7 that have similar reference numbers as elements of FIGS. 5 and 6 may have similar structures and functions (e.g., reference numbers sharing the two right-most numeric digits).

In some embodiments, ring resonator 718 comprises a waveguide 750, a waveguide 752, and a ring structure 754. Ring structure 754 may comprise a waveguide. The structures of ring resonator 718 may be implemented on a substrate 710. Waveguides 750 and 752 are disposed proximate to ring waveguide (e.g., in the order of a wavelength of radiation) such that they are optically coupled.

In some embodiments, radiation from a source (e.g., source 512) may be input and guided through waveguide 750. As the input radiation passes by ring structure 754, at least a portion of the input radiation may couple into ring structure 754. Ring structure 754 comprises a resonant wavelength such that radiation comprising wavelengths approximately the resonant wavelength are coupled into ring structure 754 while other wavelengths are unlikely to be incoupled. Radiation in ring structure 754 may then be outcoupled to waveguide 752. Radiation outcoupled to waveguide 752 may be guided back to the source (e.g., source 512 (FIG. 5)) for further interaction (e.g., amplification and/or narrowing of the generated wavelengths by the source).

Though a single ring structure is shown in FIG. 7, in some embodiments, ring structure 754 may comprise two or more rings. An example of two or more rings may be when implementing an add/drop filter configuration.

In some embodiments, ring resonator 718 may be a sub-section of a larger scale resonator. For example, a source (e.g., source 512 (FIG. 5)) may comprise the other portion of resonator structures that, when combined with ring resonator 718, may form the complete resonator. It should be appreciated that these features may also be used implemented in, for example, resonator 518 (FIG. 5), which is not limited to ring resonators.

Figure 8:
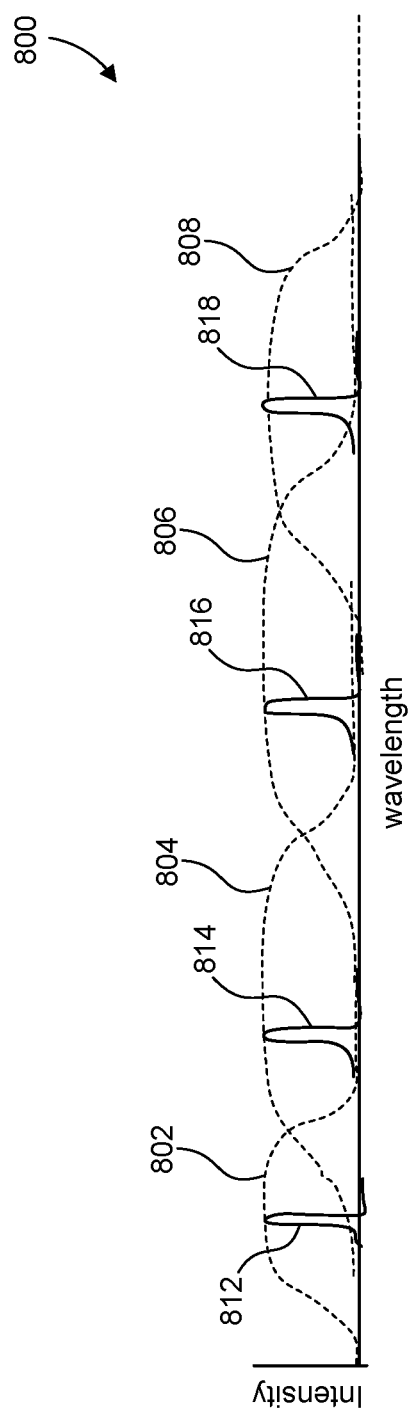
FIG. 8 shows a graph of the spectrum generated by an illumination system, according to some embodiments.

FIG. 8 shows a graph 800 of the spectrum generated by an illumination system, according to some embodiments. Graph 800 provides a qualitative representation of intensities and wavelengths provided by an illumination with multiple sources (e.g., source 512, source 514, and/or additional source(s) 516 (FIG. 5). The vertical axis represents intensity and the horizontal axis represents wavelength.

In some embodiments, a source (e.g., source 512 (FIG. 5)) may generate a wavelength band 802. Another source (e.g., source 514 (FIG. 5)) may generate a wavelength band 804. A similar relationship follows for additional sources and wavelength bands 806 and 808. It should be appreciated that the number of sources used and wavelength bands generated is not limited to the four depicted in FIG. 8, and more or fewer may be employed.

In some embodiments, higher wavelengths of wavelength band 802 partially overlap the lower wavelengths of wavelength band 804. Higher wavelengths of wavelength band 804 partially overlap the lower wavelengths of wavelength band 806. Higher wavelengths of wavelength band 806 partially overlap the lower wavelengths of wavelength band 808. Each wavelength band shares one or more wavelengths such that an illumination system (e.g., illumination system 508) is capable of covering a continuous spectrum.

In some embodiments, a resonator (e.g., resonator 518 (FIG. 5)) may narrow wavelength band 802 such that the generated wavelengths are now encompassed in narrowed wavelength band 812. Another resonator (e.g., resonator 520 (FIG. 5)) may narrow wavelength band 804 such that the generated wavelengths are now encompassed in narrowed wavelength band 814. A similar relationship follows for additional resonators and narrowed wavelength bands 816 and 818. As mentioned earlier, it is possible to shift the locations of the narrowed wavelength bands as well as adjust their widths based on adjustments of the respective resonators.

Figure 9:
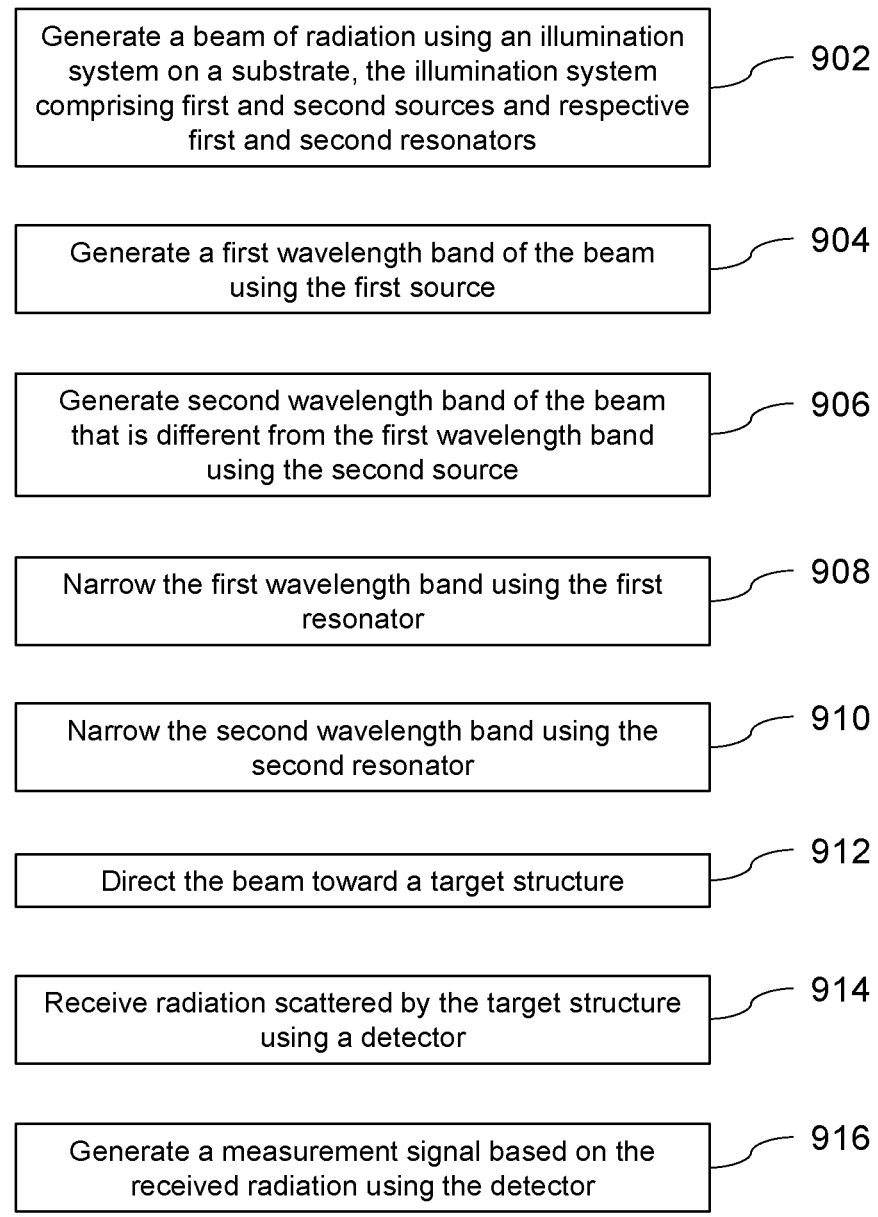
FIG. 9 shows method steps for performing functions of embodiments described herein, according to some embodiments.

FIG. 9 shows method steps for performing functions described herein, according to some embodiments. The method steps of FIG. 9 can be performed in any conceivable order and it is not required that all steps be performed. Moreover, the method steps of FIG. 9 described above merely reflect an example of steps and are not limiting. That is, further method steps and functions may be envisaged based embodiments described in reference to FIGS. 1-8.

At step 902, a beam of radiation may be generated using an illumination system. The illumination system may comprise first and second sources and respective first and second resonators.

At step 904, a first wavelength band of the beam may be generated using the first source.

At step 906, a second wavelength band of the beam may be generated using the second source. The second wavelength band is different than the first wavelength band.

At step 908, the first wavelength band may be narrowed using the first resonator.

At step 910, the second wavelength band may be narrowed using the second resonator.

At step 912, the beam may be directed toward a target structure.

At step 914, radiation scattered by the target structure may be received using a detector.

At step 916, a measurement signal may be generated using the detector based on the received radiation.

In some embodiments, an optical measurement performed on a substrate product (e.g., a wafer) may comprise capturing a high definition image (e.g., using a camera detector) of a target structure on a substrate. One commercially available example is the previously mentioned Yieldstar™ of ASML. Embodiments of the present disclosure (e.g., FIGS. 5-8) may also be used to perform image capture measurements. Referring to FIG. 5, for example, from the measurement signal generated by detector 528, a lithographic property of substrate 536 may be determined (e.g., overlay error, critical dimension parameters, and the like). Furthermore, known computational enhancement techniques may be used for enhancing image clarity/focus of the detected image and/or reducing aberrations arising from the optics of metrology apparatus 502.

In some embodiments, when performing a lithographic process on a substrate, it is important for the substrate to be in precise alignment within the lithographic apparatus such that the newly applied layer lays on top of existing layers on the substrate with precise positioning (overlay). Therefore, lithographic apparatuses rely on metrology systems to measure the position of the substrate relative to the position of the projected illumination pattern of the new layer (e.g., alignment sensors, position sensors IF1 and IF2 in FIG. 1A). Commercially available examples of alignment sensors are the previously mentioned SMASH™ and ATHENA™ sensor by ASML of Netherlands. Structures and functions of alignment sensors have been discussed in reference to FIG. 4 and in U.S. Pat. No. 6,961,116 and U.S. Pub. Appl. No. 2009/195768, which are all incorporated by reference herein in their entireties.

Other aspects of the invention are set out in the following numbered clauses.

1. A system comprising:
an illumination system on a substrate, the illumination system configured to generate a beam of radiation and comprising first and second sources configured to generate respective first and second different wavelength bands and first and second resonators optically coupled to respective ones of the first and second sources and configured to narrow respective ones of the first and second wavelength bands;
an optical element configured to direct the beam toward a target structure; and
a detector configured to receive radiation returning from the target structure and to generate a measurement signal based on the received radiation.

2. The system of clause 1, wherein the illumination system is further configured to adjust the narrowed respective ones of the first and second wavelength bands based on an adjustment of a resonant wavelength of respective ones of the first and second resonators.

3. The system of clause 1, wherein the first and second wavelength bands comprise a shared wavelength.

4. The system of clause 1, wherein the illumination system is further configured to operate within a broad wavelength range of approximately 200-2000 nm and to select at least one of the narrowed respective ones of the first and second wavelength bands from the broad wavelength range.

5. The system of clause 1, wherein at least one of the narrowed respective ones of the first and second wavelength bands is approximately 20 nm wide or less.

6. The system of clause 1, wherein at least one of the narrowed respective ones of the first and second wavelength bands is approximately 1 nm wide or less.

7. The system of clause 1, wherein:
the illumination system is further configured to adjust a width of at least one of the narrowed respective ones of the first and second wavelength bands based on a modulation of one or more properties of a respective one of the first and second resonators; and the one or more properties comprises at least one of a resonant wavelength and Q-factor.

8. The system of clause 1, wherein the illumination system further comprises: a third source configured to generate a third wavelength band of the beam different from the first and second wavelength bands; and
a third resonator optically coupled to the third source device and configured to narrow the third wavelength band.

9. The system of clause 1, wherein the first source is configured to be unpowered or have a suppressed output while the second source is powered.

10. The system of clause 1, wherein the substrate further comprises:
a multiplexer element configured to direct radiation corresponding to the first wavelength band and radiation corresponding to the second wavelength band along a shared optical axis.

11. The system of clause 1, wherein the illumination system further comprises an illumination monitor configured to monitor one or more properties of the beam and the illumination system is further configured to send a portion of the beam to the illumination monitor.

12. The system of clause 11, wherein the one or more properties comprises at least one of a dose, a position, an intensity, a polarization, a spectral bandwidth, and a wavelength.

13. The system of clause 11, wherein:
at least the first source and the first resonator are further configured to form a feedback loop;
the illumination monitor is further configured to monitor radiation in the feedback loop; and
the illumination system is further configured to stabilize the property of the beam based on the monitored radiation in the feedback loop.

14. The system of clause 11, wherein the illumination monitor is integrated on the substrate.

15. The system of clause 1, wherein at least a portion of the illumination system comprises an integrated photonic device comprising at least the first source and the first resonator.

16. The system of clause 1, wherein the system has a footprint area less than approximately 2000 mm², 1000 mm², 500 mm², 100 mm², 50 mm², 25 mm², or 16 mm².

17. The system of clause 1, wherein the detector comprises an image capture device.

18. The system of clause 1, wherein the first and second sources each comprise a superluminescent diode.

19. The system of clause 1, wherein the first and second resonators each comprise a ring resonator.

20. The system of clause 1, wherein the illumination system:
    further comprises a first polarizer; and
    is further configured to adjust a polarization of the beam based on user-input.

21. The system of clause 20, wherein:
    the illumination system further comprises a second polarizer associated with an optical path of the second source;
    the first polarizer is associated with an optical path of the first source; and
    the illumination system is further configured to select at least one of the optical paths of the first and second sources.

22. The system of clause 1, wherein at least one of the first source, the second source, the first resonator, and the second resonator is modular.

23. The system of clause 1, further comprising:
    a second illumination system on a second substrate, the second illumination system configured to generate a second beam of radiation and comprising first and second sources configured to generate respective first and second different wavelength bands of the second beam and first and second resonators optically coupled to respective ones of the first and second sources of the second illumination system and configured to narrow respective ones of the first and second wavelength bands of the second beam;
    a second optical element configured to direct the second beam toward a second target structure; and
    a second detector configured to receive radiation from the second target structure and to generate a measurement signal based on the received radiation.

24. The system of clause 1, further comprising:
    additional illumination systems on corresponding additional substrates configured to generate corresponding beams of radiation and comprising corresponding first and second sources configured to generate respective first and second different wavelength bands of the corresponding beams and corresponding first and second resonators optically coupled to respective ones of the corresponding first and second sources and configured to narrow respective ones of the first and second wavelength bands of the corresponding beams;
    additional optical elements configured to direct the corresponding beams toward corresponding target structures; and
    additional detectors configured to receive radiation from the corresponding target structures and to generate corresponding measurement signals based on the received radiation scattered by the corresponding target structures.

25. A lithographic apparatus:
    an illumination apparatus configured to illuminate a pattern of a patterning device;
    a projection system configured to project an image of the pattern onto a target substrate; and
    a metrology system comprising:
        an illumination system on a substrate, the illumination system configured to generate a beam of radiation and comprising first and second sources configured to generate respective first and second different wavelength bands and first and second resonators optically coupled to respective ones of the first and second sources and configured to narrow respective ones of the first and second wavelength bands;
        an optical element configured to direct the beam toward a target structure; and
        a detector configured to receive radiation from the target structure and to generate a measurement signal based on the received radiation.

26. A method comprising:
    generating a beam of radiation using an illumination system on a substrate, the illumination system comprising first and second sources and first and second resonators;
    generating a first wavelength band of the beam using the first source;
    generating second wavelength band of the beam that is different from the first wavelength band using the second source;
    narrowing the first wavelength band using the first resonator;
    narrowing the second wavelength band using the second resonator;
    directing the beam toward a target structure;
    receiving radiation from the target structure using a detector; and
    generating a measurement signal based on the received radiation using the detector.

Despite some differences between SMASH-style sensors (e.g., implemented in lithographic apparatuses for alignment) and Yieldstar-style sensors (e.g., implemented outside of a lithographic apparatus for product inspection), the concepts of reduced-footprint metrology apparatus, integrated photonics for illumination, and using a plurality of metrology apparatuses in parallel for measuring more targets in a given time, and the like are applicable to both sensor types.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation," "beam," "light," "illumination," and the like as used herein may encompass all types of electromagnetic radiation, for example, ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the disclosure have been described above, it will be appreciated that embodiments of the present disclosure may be practiced otherwise than as described. The descriptions are intended to be illustrative, not limiting. Thus it will be apparent to one skilled in the art that modifications may be made to the disclosure as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the protected subject matter should not be limited by any of the above-described exemplary embodiments, but should be defined only in accordance with the following claims and their equivalents.

The invention claimed is:

1. A system comprising:
   an illumination system on a substrate, the illumination system configured to generate a beam of radiation and comprising first and second sources configured to generate respective first and second different wavelength bands and first and second resonators optically coupled to respective ones of the first and second sources and configured to narrow respective ones of the first and second wavelength bands;
   an optical element configured to direct the beam toward a target structure; and
   a detector configured to receive radiation returning from the target structure and to generate a measurement signal based on the received radiation.

2. The system of claim 1, wherein the illumination system is further configured to adjust the narrowed respective ones of the first and second wavelength bands based on an adjustment of a resonant wavelength of respective ones of the first and second resonators.

3. The system of claim 1, wherein the first and second wavelength bands comprise a shared wavelength.

4. The system of claim 1, wherein the illumination system is further configured to operate within a broad wavelength range of approximately 200-2000 nm and to select at least one of the narrowed respective ones of the first and second wavelength bands from the broad wavelength range.

5. The system of claim 1, wherein at least one of the narrowed respective ones of the first and second wavelength bands is approximately 20 nm wide or less.

6. The system of claim 1, wherein at least one of the narrowed respective ones of the first and second wavelength bands is approximately 1 nm wide or less.

7. The system of claim 1, wherein:
   the illumination system is further configured to adjust a width of at least one of the narrowed respective ones of the first and second wavelength bands based on a modulation of one or more properties of a respective one of the first and second resonators; and
   the one or more properties comprises at least one of a resonant wavelength and Q-factor.

8. The system of claim 1, wherein the illumination system further comprises:
a third source configured to generate a third wavelength band of the beam different from the first and second wavelength bands; and
a third resonator optically coupled to the third source device and configured to narrow the third wavelength band.

9. The system of claim 1, wherein the first source is configured to be unpowered or have a suppressed output while the second source is powered.

10. The system of claim 1, wherein the substrate further comprises:
a multiplexer element configured to direct radiation corresponding to the first wavelength band and radiation corresponding to the second wavelength band along a shared optical axis.

11. The system of claim 1, wherein the illumination system further comprises an illumination monitor configured to monitor one or more properties of the beam and the illumination system is further configured to send a portion of the beam to the illumination monitor.

12. The system of claim 11, wherein the one or more properties comprises at least one of a dose, a position, an intensity, a polarization, a spectral bandwidth, and a wavelength.

13. The system of claim 11, wherein:
at least the first source and the first resonator are further configured to form a feedback loop;
the illumination monitor is further configured to monitor radiation in the feedback loop; and
the illumination system is further configured to stabilize the one or more properties of the beam based on the monitored radiation in the feedback loop.

14. The system of claim 11, wherein the illumination monitor is integrated on the substrate.

15. The system of claim 1, wherein at least a portion of the illumination system comprises an integrated photonic device comprising at least the first source and the first resonator.

16. The system of claim 1, wherein the system has a footprint area less than approximately 2000 mm$^2$, 1000 mm$^2$, 500 mm$^2$, 100 mm$^2$, 50 mm$^2$, 25 mm$^2$, or 16 mm$^2$.

17. The system of claim 1, wherein the detector comprises an image capture device.

18. The system of claim 1, wherein the first and second sources each comprise a superluminescent diode.

19. The system of claim 1, wherein the first and second resonators each comprise a ring resonator.

20. The system of claim 1, wherein the illumination system:
further comprises a first polarizer; and
is further configured to adjust a polarization of the beam based on user-input.

21. The system of claim 20, wherein:
the illumination system further comprises a second polarizer associated with an optical path of the second source;
the first polarizer is associated with an optical path of the first source; and
the illumination system is further configured to select at least one of the optical paths of the first and second sources.

22. The system of claim 1, wherein at least one of the first source, the second source, the first resonator, and the second resonator is modular.

23. The system of claim 1, further comprising:
a second illumination system on a second substrate, the second illumination system configured to generate a second beam of radiation and comprising first and second sources configured to generate respective first and second different wavelength bands of the second beam and first and second resonators optically coupled to respective ones of the first and second sources of the second illumination system and configured to narrow respective ones of the first and second wavelength bands of the second beam;
a second optical element configured to direct the second beam toward a second target structure; and
a second detector configured to receive radiation from the second target structure and to generate a measurement signal based on the received radiation.

24. The system of claim 1, further comprising:
additional illumination systems on corresponding additional substrates configured to generate corresponding beams of radiation and comprising corresponding first and second sources configured to generate respective first and second different wavelength bands of the corresponding beams and corresponding first and second resonators optically coupled to respective ones of the corresponding first and second sources and configured to narrow respective ones of the first and second wavelength bands of the corresponding beams;
additional optical elements configured to direct the corresponding beams toward corresponding target structures; and
additional detectors configured to receive radiation from the corresponding target structures and to generate corresponding measurement signals based on the received radiation scattered by the corresponding target structures.

25. A lithographic apparatus comprising:
an illumination apparatus configured to illuminate a pattern of a patterning device;
a projection system configured to project an image of the pattern onto a target substrate; and
a metrology system comprising:
an illumination system on a substrate, the illumination system configured to generate a beam of radiation and comprising first and second sources configured to generate respective first and second different wavelength bands and first and second resonators optically coupled to respective ones of the first and second sources and configured to narrow respective ones of the first and second wavelength bands;
an optical element configured to direct the beam toward a target structure; and
a detector configured to receive radiation from the target structure and to generate a measurement signal based on the received radiation.

26. A method comprising:
generating a beam of radiation using an illumination system on a substrate, the illumination system comprising first and second sources and first and second resonators;
generating a first wavelength band of the beam using the first source;
generating a second wavelength band of the beam that is different from the first wavelength band using the second source;
narrowing the first wavelength band using the first resonator;

narrowing the second wavelength band using the second resonator;
directing the beam toward a target structure;
receiving radiation from the target structure using a detector; and
generating a measurement signal based on the received radiation using the detector.

\* \* \* \* \*